(12) United States Patent
Kim

(10) Patent No.: US 10,966,320 B2
(45) Date of Patent: Mar. 30, 2021

(54) GAP SUPPORTER FOR PRINTED CIRCUIT BOARD, AND PACKAGE INCLUDING GAP SUPPORTER FOR PRINTED CIRCUIT BOARD AND INSULATION SHEET COUPLED THERETO

(71) Applicants: GNE TECH CO., LTD., Seongnam-si (KR); Jae Ku Kim, Seoul (KR)

(72) Inventor: Jae Ku Kim, Seoul (KR)

(73) Assignees: GNE TECH CO., LTD., Seongnam-si (KR); Jae Ku Kim, Seoul (KR)

( * ) Notice: Subject to any disclaimer, the term of this patent is extended or adjusted under 35 U.S.C. 154(b) by 0 days.

(21) Appl. No.: 16/979,809

(22) PCT Filed: Sep. 20, 2018

(86) PCT No.: PCT/KR2018/011086
§ 371 (c)(1),
(2) Date: Sep. 10, 2020

(87) PCT Pub. No.: WO2019/190009
PCT Pub. Date: Oct. 3, 2019

(65) Prior Publication Data
US 2021/0059051 A1   Feb. 25, 2021

(30) Foreign Application Priority Data

Mar. 30, 2018 (KR) .................. 10-2018-0037687
Sep. 18, 2018 (KR) .................. 10-2018-0111222

(51) Int. Cl.
*H05K 1/14* (2006.01)
*H05K 7/14* (2006.01)
*H05K 1/02* (2006.01)

(52) U.S. Cl.
CPC .......... *H05K 1/141* (2013.01); *H05K 1/0271* (2013.01); *H05K 7/1418* (2013.01); *H05K 2201/2036* (2013.01)

(58) Field of Classification Search
CPC ................................................. H05K 1/14–148
See application file for complete search history.

(56) References Cited

U.S. PATENT DOCUMENTS

| 9,305,684 | B2 | 4/2016 | Kim |
| 2008/0143918 | A1 | 6/2008 | Kim |

FOREIGN PATENT DOCUMENTS

| JP | 2007-005806 | 1/2007 |
| JP | 2012-028624 A | 2/2012 |

(Continued)

OTHER PUBLICATIONS

KR Office Action dated Dec. 13, 2019 as received in Application No. 10-2018-0111222.

(Continued)

*Primary Examiner* — Jeremy C Norris
(74) *Attorney, Agent, or Firm* — Maschoff Brennan

(57) ABSTRACT

The present invention relates to a gap supporter for a printed circuit board, and a package including a gap supporter for a printed circuit board and an insulation sheet coupled thereto. A gap supporter for a printed circuit board includes a fixed body part which has a metal thin-film formed on the surface of the lower end thereof, and is fixed to one surface of the printed circuit board by soldering of the metal thin-film; a clamping groove formed in a groove shape on the fixed body part, and having an insulation sheet inserted and clamped thereto to protect an element on one surface of the printed circuit board; and an anti-separation part formed on the other end of the fixed body part so as to be defined by the clamping (Continued)

groove, so as to fix the insulation sheet and prevent the insulation sheet from being separated.

17 Claims, 12 Drawing Sheets

(56) References Cited

FOREIGN PATENT DOCUMENTS

| KR | 10-2008-0054761 A | 6/2008 |
|---|---|---|
| KR | 10-1009280 B1 | 1/2011 |
| KR | 10-2012-0111475 A | 10/2012 |
| KR | 10-1277489 B1 | 6/2013 |

OTHER PUBLICATIONS

KR Decision to Grant dated Jul. 23, 2020 as received in Application No. 10-2018-0111222.

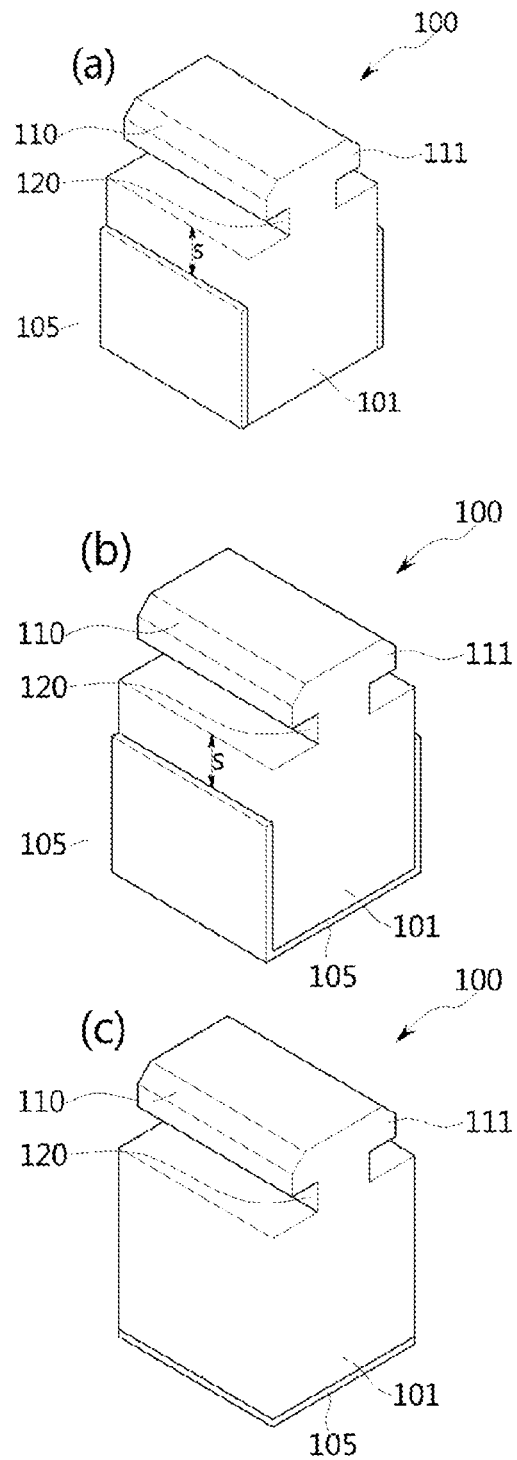
[FIG. 1]

[FIG. 2]
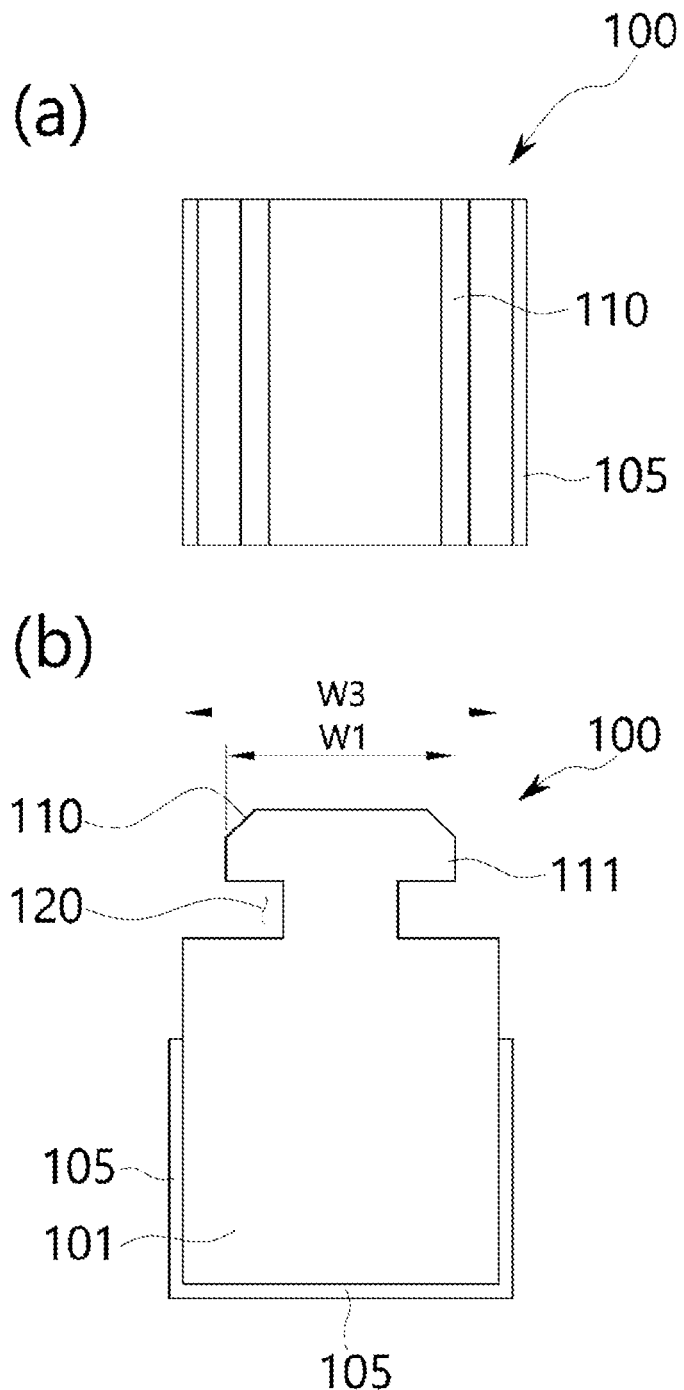

[FIG. 3]
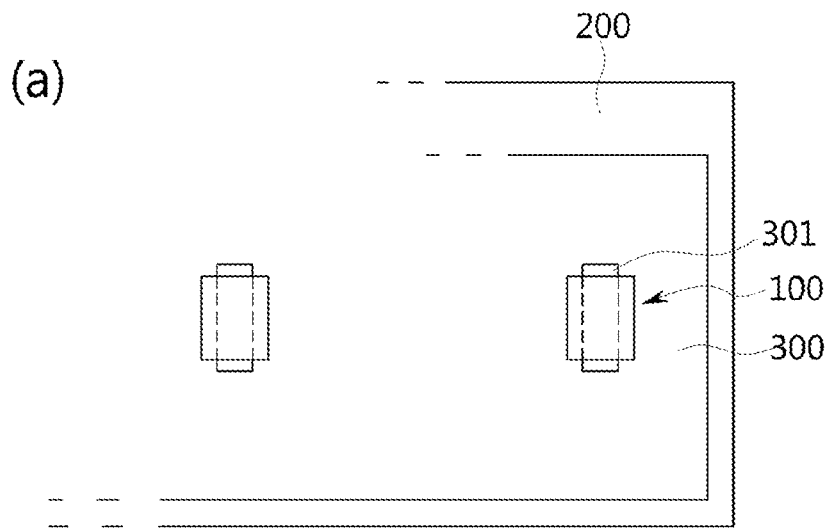
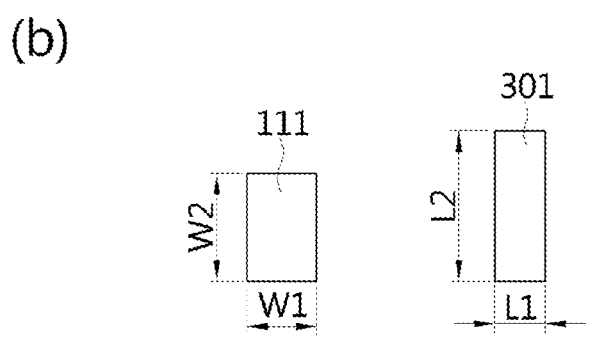
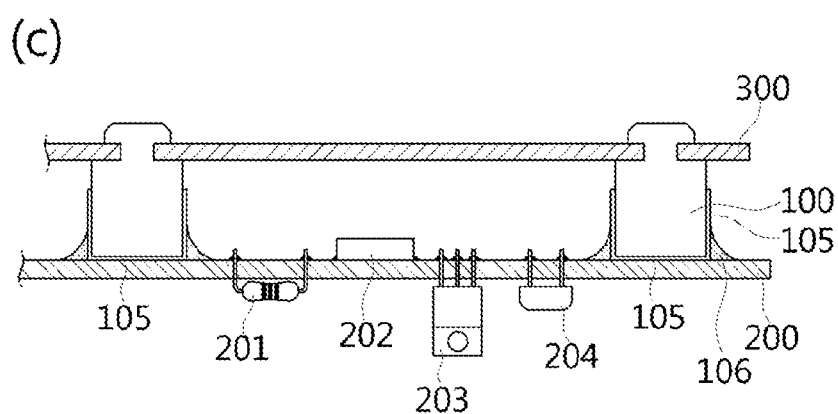

[FIG. 4]
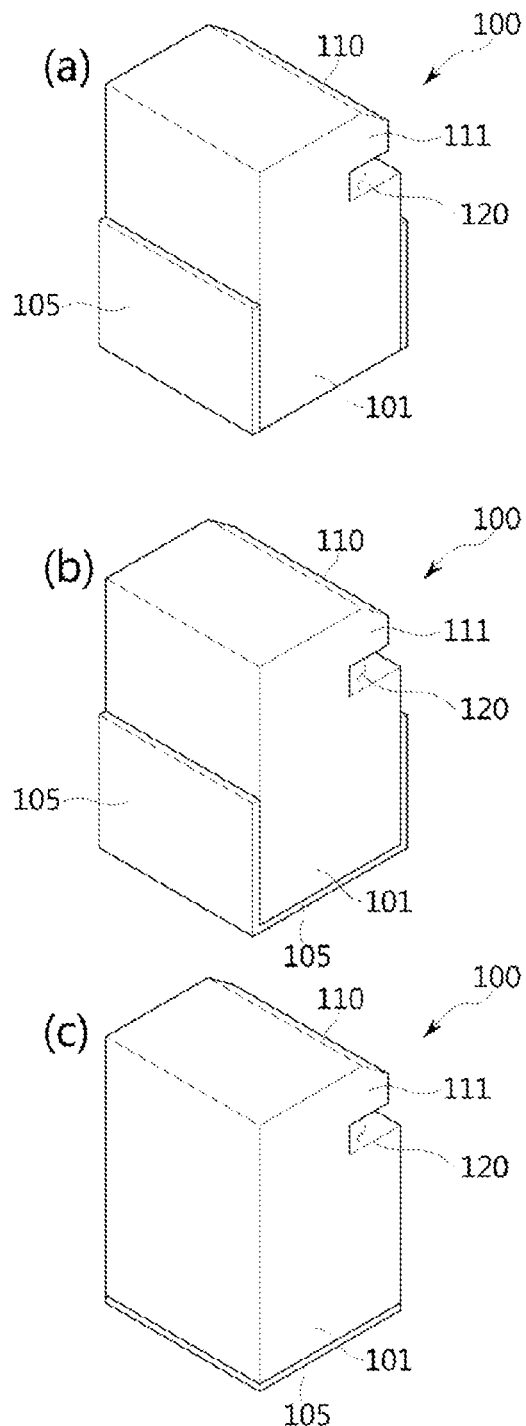

[FIG. 5]
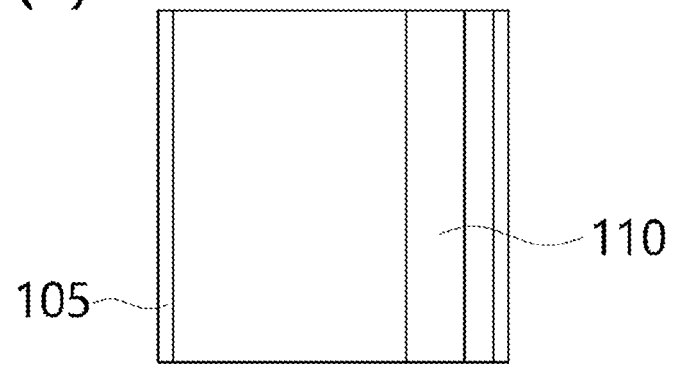
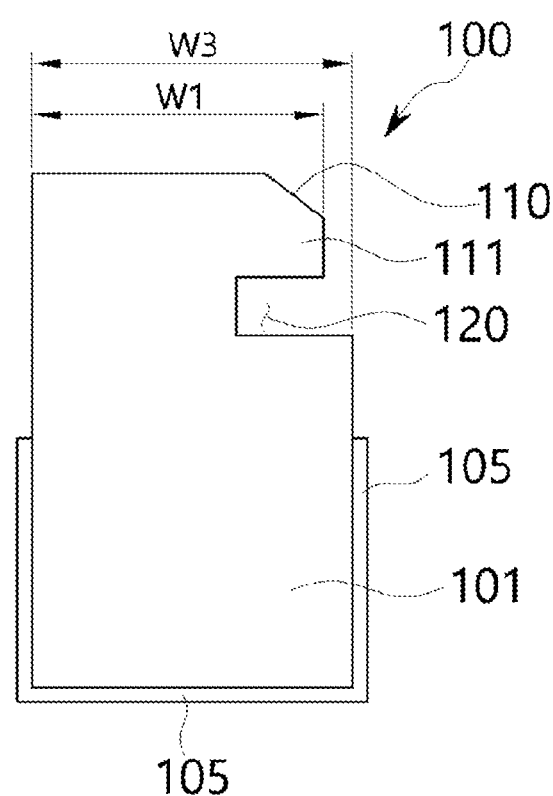

[FIG. 6]
(a)
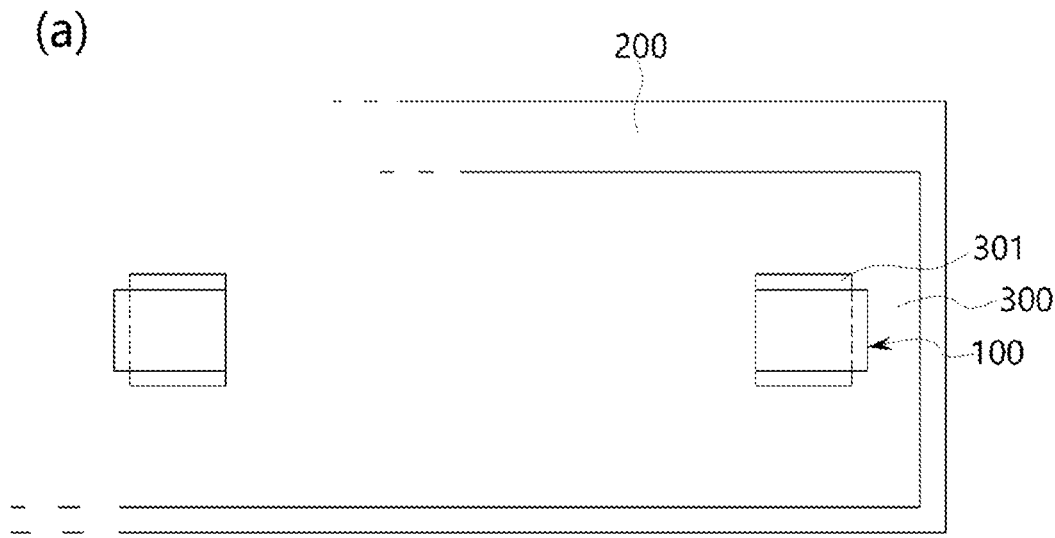
(b)
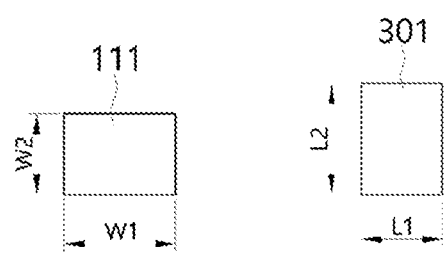
(c)
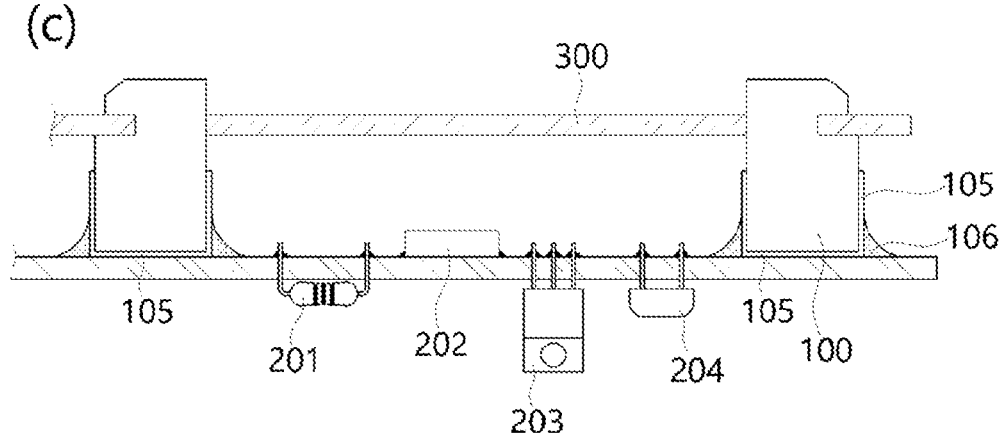

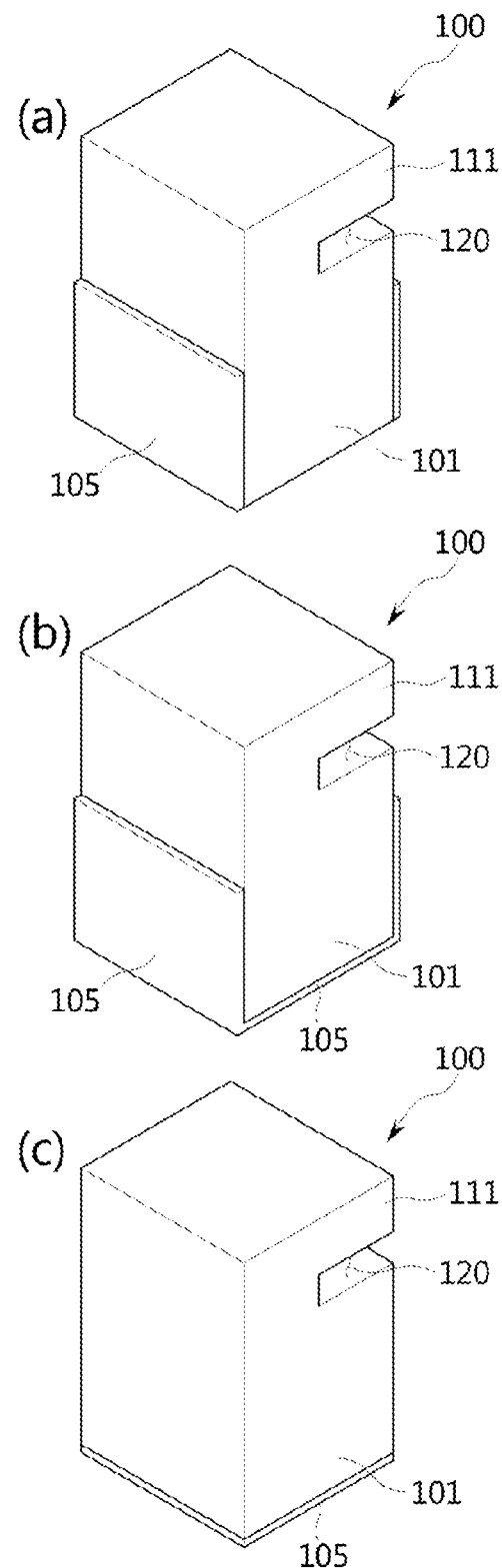
[FIG. 7]

[FIG. 8]
(a)
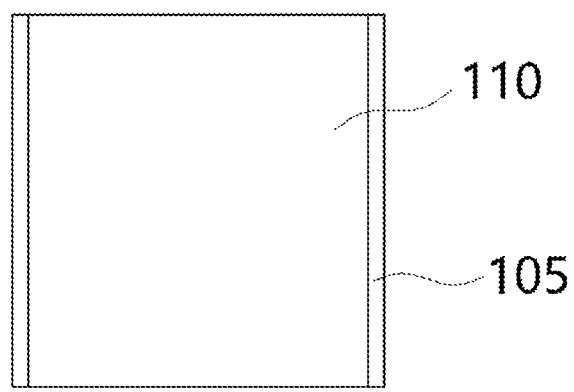
(b)
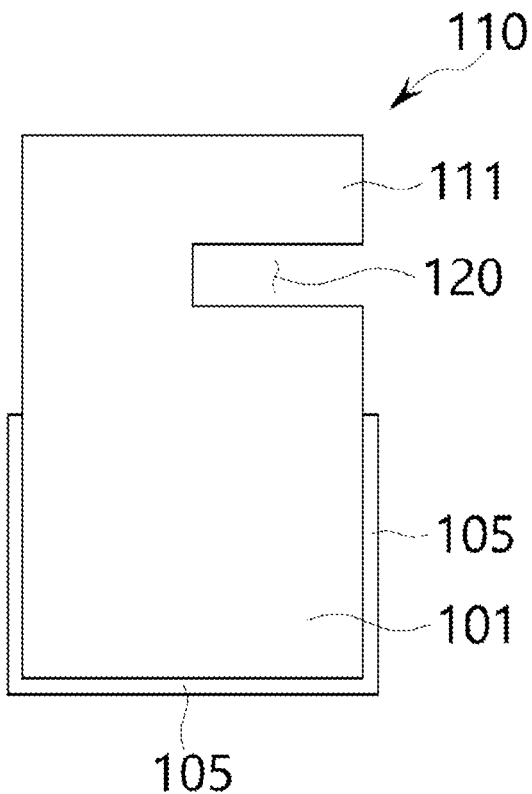

[FIG. 9]
(a)
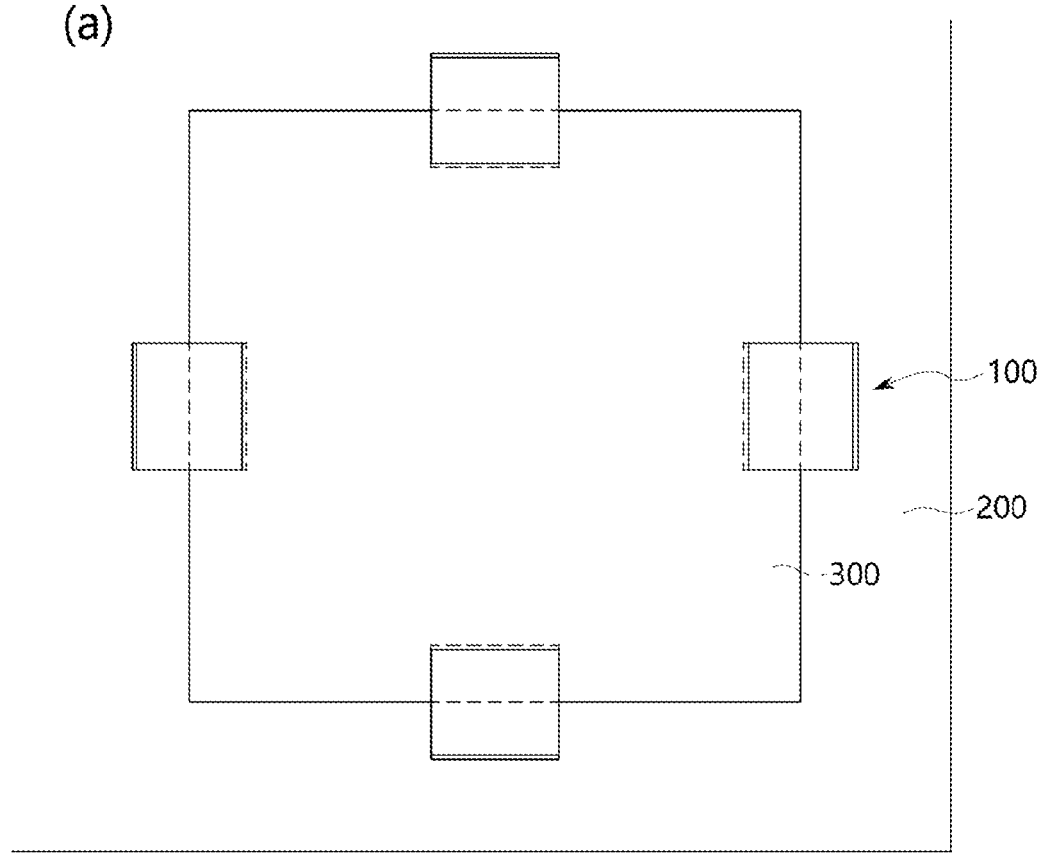
(b)
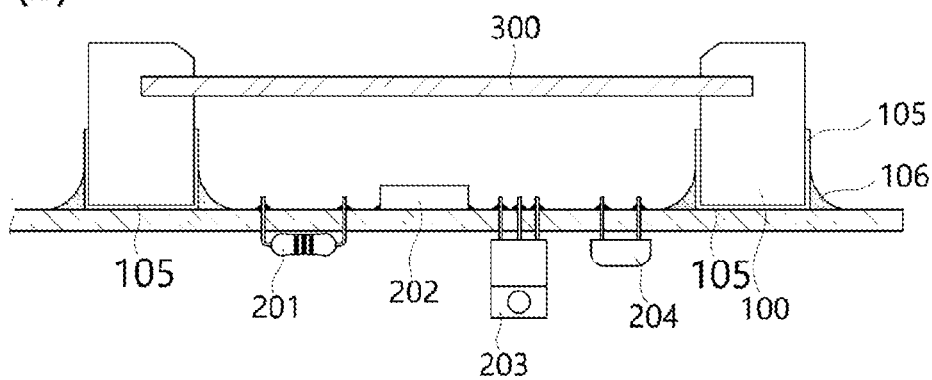

[FIG. 10]
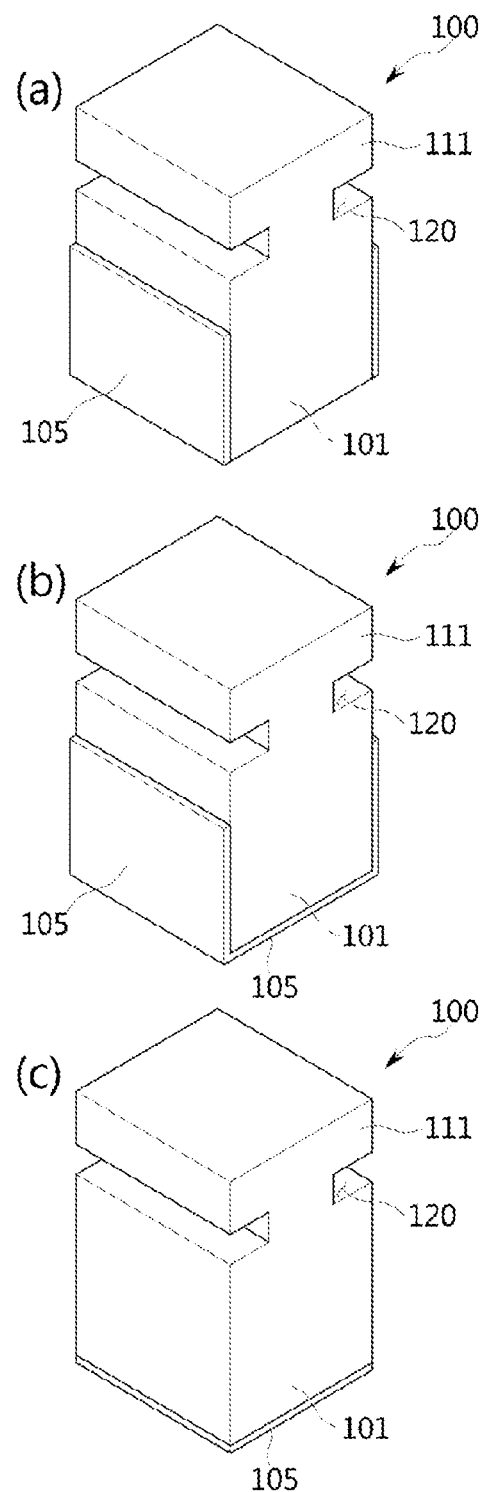

[FIG. 11]
(a)
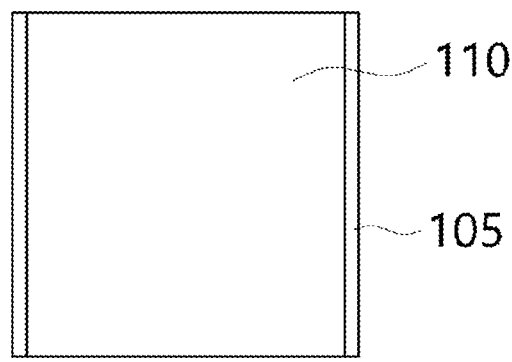
(b)
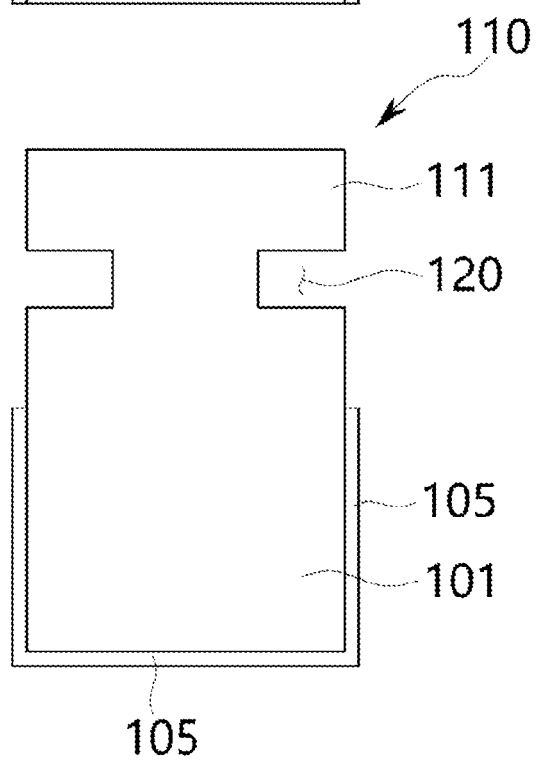

[FIG. 12]
(a)
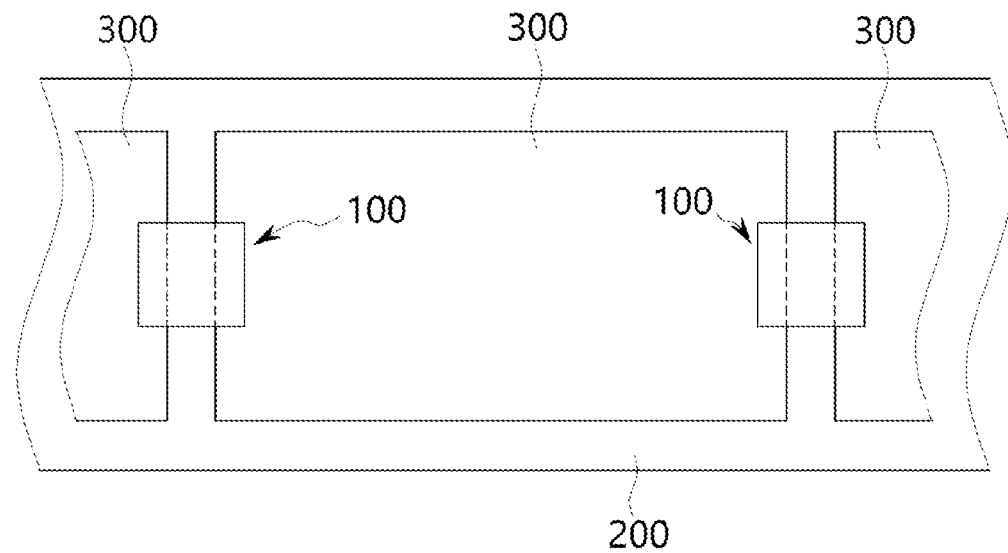
(b)
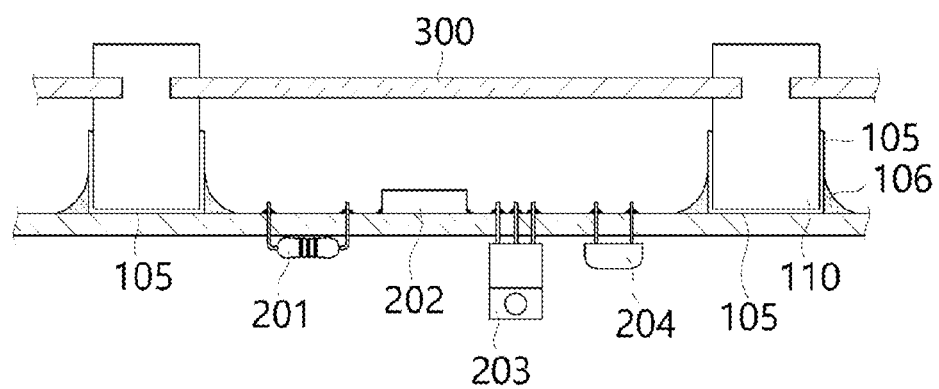

GAP SUPPORTER FOR PRINTED CIRCUIT BOARD, AND PACKAGE INCLUDING GAP SUPPORTER FOR PRINTED CIRCUIT BOARD AND INSULATION SHEET COUPLED THERETO

FIELD OF INVENTION

An embodiment of the present invention relates to a gap supporter for a printed circuit board, and a package including the gap supporter and an insulation sheet joined thereto.

BACKGROUND OF INVENTION

As a flat panel display becomes thinner, an LCD panel and a PCB provided with a drive circuit for driving the LCD panel are closely positioned to face each other. This causes a problem that the PCB is pressed against the LCD panel or a housing case and thus electrical short circuit occurs.

Further, since heights of electronic elements mounted on the PCB or soldering parts are not constant, there is a problem such as bending of the PCB due to a difference in heights when the PCB and LCD panel are close to each other.

Referring to a conventional backlight assembly and a liquid crystal display device using the same disclosed in Japanese Patent Laid-Open Publication No. 2007-5806 (Laid-opened on Jan. 10, 2007), a printed circuit board 210 disposed on the bottom of a backlight assembly 2000 by bending a flexible printed circuit board 230 is described. In this case, the LCD device comprises the display assembly 1000 as well as the backlight assembly 2000, wherein the display assembly 1000 includes an LCD panel 100, a driving circuit unit 200 and an upper housing member 300, while the backlight assembly 2000 includes a lamp unit 400, a light guide plate 500, a reflecting plate 600, an optical sheet 700, a lower housing member 800 and a buffer member 800. Further, a laminate structure from the reflecting plate 600 to the LCD panel 100 is solidly maintained by the lower housing member 800 and the upper housing member 300, while the flexible circuit board 230 is bent downward and thus the PCB 210 is disposed on the bottom of the lower housing member 800. The lower housing member 800 is provided with the buffer member 900 to prevent damage to the flexible circuit board 230.

As such, in the prior art, as a flat panel display device becomes slim, the PCB 210 is positioned to be substantially in close contact with the bottom of the lower housing member 800, therefore, a little gap must be present between the PCB 210 and the lower housing member 800 so as to protect electronic components mounted on the PCB 210.

In addition, since a height of the electronic component mounted on the PCB 210 or the soldering part is not constant, the PCB 210 may be bent when it is in close contact with the lower housing member 800. Therefore, in order to prevent such bending, a little gap should be present therebetween. Accordingly, in order to save such gap, it is necessary to provide a gap supporter between the lower housing member 800 and the PCB 210.

However, the gap supporter according to the related art has failed to firmly secure the insulation sheet for protecting PCB, and also entails a problem in that a worker must manually work on the PCB, hence reducing productivity.

SUMMARY OF INVENTION

Technical Problem to be Solved

The present invention has been proposed to overcome the aforementioned problems, and an object of the present disclosure is to provide a substrate or board with a structure to protect terminals of elements and a printed circuit by means of a gap supporter to secure an insulation sheet at a position spaced from the elements or the printed circuit.

Further, according to the present invention, it is easy to couple the insulation sheet to a structure of an inclined portion in the gap supporter, and the insulation sheet may be further firmly coupled and secured to the gap supporter owing to a stepped structure of a coupling groove.

Further, according to the present invention, the gap supporter may be attached and mounted on the substrate by means of soldering, thereby achieving mass production through automation without a need for manual work.

In addition, according to the present invention, there is provided an optimal method of joining an insulation sheet suitable for characteristics of individual printed circuit boards, based on the structure of the gap supporter, thereby improving efficiency and productivity of a manufacturing process.

Technical Solution

In order to solve the above problems, a package including a gap supporter for a printed circuit board and an insulation sheet joined thereto according to one embodiment of the present invention may include: a printed circuit board on which elements are mounted; an insulation sheet made of an insulating material to protect the elements of the printed circuit board; and a gap supporter that includes a fixed body part having a metal thin-film formed on the surface of a lower end thereof and being fixed by soldering the metal thin-film on one surface of the printed circuit board, a coupling groove which is formed in a groove shape on the fixed body part and in which the insulation sheet is inserted and coupled therein, and an anti-separation part which is formed at the other end of the fixed body part to be partitioned by the coupling groove and secures the insulation sheet in order to prevent separation of the same.

According to another embodiment of the present invention, the insulating sheet may have a hole, the coupling groove of the gap supporter may be coupled to an end of the hole in the insulation sheet, and the anti-separation part in the gap supporter may prevent separation of the insulation sheet.

According to another embodiment of the present invention, a horizontal width of the anti-separation part in the gap supporter may be formed larger than a horizontal width of the hole in the insulation sheet, while a longitudinal width of the anti-separation part in the gap supporter may be formed smaller than a longitudinal width of the hole in the insulation sheet.

According to another embodiment of the present invention, a pair of gap supporters may be provided in a direction along which coupling grooves formed in the gap supporters mutually face each other.

According to another embodiment of the present invention, the coupling groove in the gap supporter is coupled to an end of the insulation sheet, and the anti-separation part in the gap supporter may prevent separation of the insulation sheet.

According to another embodiment of the present invention, a plurality of gap supporters may be arranged to be mutually symmetrical with one another, and a coupling groove in each gap supporter may be formed on one side at an upper end of the fixed body part to secure the insulation sheet.

According to another embodiment of the present invention, a plurality of gap supporters may be arranged to be mutually symmetrical with one another.

According to another embodiment of the present invention, the coupling groove in the gap supporter may be formed on both sides at an upper end of the fixed body part to secure a plurality of insulation sheets.

According to another embodiment of the present invention, the coupling groove in the gap supporter may be formed on either or both sides at an upper end of the fixing body part, so as to secure the insulation sheet sliding and being joined in a side direction.

A gap supporter fora printed circuit board according to an embodiment of the present invention may include: a fixed body part which has a metal thin-film formed on the surface of a lower end of the fixed body part, and is fixed by soldering the metal thin-film on one surface of the printed circuit board; a coupling groove which is formed in a groove shape on the fixed body part, and in which an insulation sheet for protecting elements on one surface of the printed circuit board is inserted and coupled; and an anti-separation part which is formed on the other end of the fixed body part to be partitioned by the coupling groove, and secures the insulation sheet so as to prevent separation of the same.

According to another embodiment of the present invention, the metal thin-film may be formed on both side surfaces at a lower end of fixed body part formed in a hexahedral shape.

According to another embodiment of the present invention, the coupling groove may be formed at either or both sides at an upper end of the fixed body part to face the inside of the fixed body part.

According to another embodiment of the present invention, the coupling groove may be formed spaced apart from the metal thin-film.

According to another embodiment of the present invention, the coupling groove may be joined with a hole formed in the insulation sheet or an end of the insulation sheet.

According to another embodiment of the present invention, the gap supporter may further include an inclined portion formed by chamfering corners of either or both sides at an upper end of the anti-separation part.

According to another embodiment of the present invention, a width of the anti-separation part may be formed smaller than a width of the fixed body part.

According to another embodiment of the present invention, the coupling groove may be formed on either or both sides at an upper end of the fixed body part, so as to secure the insulation sheet sliding and being joined in a side direction.

Effect of Invention

According to the embodiments of the present invention, a substrate with a structure to protect terminals of elements and a printed circuit by means of a gap supporter to secure an insulation sheet at a position spaced apart from the elements and the printed circuit.

Further, according to the embodiments of the present invention, it is easy to couple the insulation sheet to a structure of an inclined portion in the gap supporter, and the insulation sheet may be further firmly coupled and secured to the gap supporter owing to a stepped structure of the coupling groove.

Further, according to the embodiments of the present invention, the gap supporter may be attached and mounted on the substrate by means of soldering, thereby achieving mass production through automation without a need for manual work.

In addition, according to the embodiments of the present invention, there is provided an optimal method of joining an insulation sheet suitable for characteristics of individual printed circuit boards, based on the structure of the gap supporter, thereby improving efficiency and productivity of a manufacturing process.

BRIEF DESCRIPTION OF DRAWINGS

FIG. 1 and FIG. 2 are perspective views illustrating a gap supporter for a printed circuit board according to an embodiment of the present invention, and FIG. 3 illustrates a package including the gap supporter for a printed circuit board according to this embodiment of the present invention and an insulation sheet joined thereto.

FIG. 4 and FIG. 5 are perspective views illustrating a gap supporter for a printed circuit board according to another embodiment of the present invention, and FIG. 6 illustrates a package including the gap supporter for a printed circuit board according to this embodiment of the present invention and an insulation sheet joined thereto.

FIG. 7 and FIG. 8 are perspective views illustrating a gap supporter for a printed circuit board according to another embodiment of the present invention, and FIG. 9 illustrates a package including the gap supporter for a printed circuit board according to this embodiment of the present invention and an insulation sheet joined thereto.

FIG. 10 and FIG. 11 are perspective views illustrating a gap supporter for a printed circuit board according to another embodiment of the present invention, and FIG. 12 illustrates a package including the gap supporter for a printed circuit board according to this embodiment of the present invention and an insulation sheet joined thereto.

DETAILED DESCRIPTION OF PREFERRED EMBODIMENTS OF INVENTION

Hereinafter, preferred embodiments of the present invention will be described in detail with reference to the accompanying drawings. However, in describing the embodiments, detailed descriptions of related functions or known configurations will be omitted if the subject matter of the present invention is undesirably ambiguous by the same. In addition, a size of each component in the drawings may be exaggerated for description, and does not mean a real size of the component that is actually applied.

FIG. 1 is a perspective view illustrating a gap supporter for a printed circuit board according to an embodiment of the present invention, and FIG. 2 illustrates a top surface and a lateral side of the gap supporter for a printed circuit board according to this embodiment of the present invention, wherein FIG. 2(a) is a top view of the gap supporter for a printed circuit board according to the embodiment of the present invention while FIG. 2(b) is a side view of the gap supporter for a printed circuit board according to the embodiment of the present invention.

Further, FIG. 3 illustrates a package including the gap supporter for a printed circuit board according to the above embodiment of the present invention and an insulation sheet joined thereto. In more detail, FIG. 3(a) is a top view of the package in which an insulating sheet is joined with the gap supporter for a printed circuit board, FIG. 3(b) illustrates the insulation sheet joined with the gap supporter for a printed circuit board and FIG. 3(c) is a side view of the package in which the insulation sheet is joined with the gap supporter for a printed circuit board according to the above embodiment of the present invention.

Hereinafter, referring to FIGS. 1 to 3, a gap supporter for a printed circuit board according to an embodiment of the present invention and the package in which an insulation sheet is joined with the gap supporter for a printed circuit board according to this embodiment of the present invention.

The embodiment illustrated in FIGS. 1 to 3 is an exemplary embodiment describing a configuration of joining an insulation sheet 300 to a gap supporter 100 on top of a printed circuit board 200.

Referring to FIG. 1 and FIG. 2, the gap supporter 100 for a printed circuit board according to an embodiment of the present invention may be configured to include a fixed body part 101, a metal thin-film 105, an anti-separation part 111, an inclined portion 110 and a coupling groove 120.

The fixed body part 101 is a component fixed on a printed circuit board, which is provided with the metal thin-film 105 on surfaces of both ends of the fixed body part 101, wherein the metal thin-film 105 may be secured on one surface of the printed circuit board by means of soldering and may be made of copper (Cu).

More specifically, when the fixed body part 101 is formed in a hexahedral shape, as shown in FIG. 1(a), the metal thin-film 105 may be formed on both side surfaces at a lower end of the fixed body part 101. Alternatively, as shown in FIG. 1(b), the metal thin-film 105 may be formed on both side surfaces and the bottom surface at a lower end of the fixed body part 101. Alternatively, as shown in FIG. 1(c), the metal thin-film 105 may be formed on the bottom surface at a lower end of the fixed body part 101.

The anti-separation part 111 may be formed at the other end of the fixed body part 101 to be partitioned by the coupling groove 120, so as to secure the insulation sheet being joined with the upper side and thus prevent separation thereof.

In this case, a width W1 of the anti-separation part 111 may be formed smaller than a width W3 of the fixed body part 101, thereby making it easier to insert the insulation sheet 300.

The inclined portion 110 may be formed in a slope shape by chamfering corners or both sides of a vertex portion at the upper end of the fixed body part 101, which corresponds to the anti-separation part 111. Further, the insulation sheet may slide along the inclined portion 110.

Herein, according to the embodiments in FIG. 1 and FIG. 2, the inclined portion 110 may be formed on surfaces of both opposite sides at the upper end of the fixed body part 101.

The insulation sheet passing through the inclined portion 110 is inserted in and coupled to the coupling groove 120. In this case, the coupling groove 120 may be formed on either or both sides at the upper end of the fixed body part 101 to face the inside of the fixed body part 101. Further, the coupling groove 120 may be formed spaced apart from the metal thin-film 105 by a distance S.

On the other hand, according to an embodiment of the present invention, a width W1 of the anti-separation part 111 at one side where the inclined portion 110 of the fixed body part 101 is formed, may be formed smaller than a width W3 at another side where the metal thin-film 105 in the fixed body part 101 is formed, so that the gap supporter 100 is stably fixed to the printed circuit board 200 while the insulation sheet 300 may be more easily inserted and stably secured therein.

In addition, no inclined portion is formed at an inner corner or the vertex portion of the coupling groove 120, whereby the insulation sheet 300 may not be easily separated from the coupling groove 120.

In other words, the width W3 at one side where the metal thin-film 105 is formed may he formed larger than the width W1 at another side where the inclined portion 100 is formed so as to provide a stepped portion, whereby the insulation sheet 300 may be stably secured by the fixed body part 101 at the side where the metal thin-film 105 is formed.

Referring to FIG. 3, a package in which an insulation sheet 300 is joined with the gap supporter 100 for a printed circuit board 200 according to the embodiment of the present invention may protect elements 201, 202, 203 and 204, and a printed circuit mounted on the printed circuit board 200 by a structure of the gap supporter 100 installed on the printed circuit board 200 to secure the insulation sheet 300.

Referring to FIG. 3(a), the insulation sheet 200 has a hole 301 and the gap supporter 100 is joined in the hole 301.

Herein, a coupling groove 120 in the gap supporter 100 is coupled at an end of the hole 301 in the insulation sheet, wherein the hole 301 of the insulation sheet 300 passing through the inclined portion 110 of the gap supporter 100 is inserted and coupled in the coupling groove 120.

That is, the hole 301 of the insulation sheet 300 may slide along the inclined portion 110 and then be coupled to the coupling groove 120.

As a result, the anti-separation part 111 of the gap supporter 100 shown in FIG. 2 may prevent separation of the insulation sheet 300.

Referring to FIG. 3(b), in order to easily insert the anti-separation part 111 of the gap supporter 100 into the hole 301 of the insulation sheet 300 and, thereafter, firmly couple the same therein without being separated, a horizontal width W1 of the anti-separation part 111 in the gap supporter 100 may be formed larger than a horizontal width L1 of the hole 301 in the insulation sheet 300, while a longitudinal width W2 of the anti-separation part 111 in the gap supporter 100 may be formed smaller than a longitudinal width L2 of the hole 301 in the insulation sheet 300.

In one embodiment of such a structure as described above, when the horizontal width W1 of the anti-separation part 111 in the gap supporter 100 ranges from 1.9 to 2.05 mm while the longitudinal width W2 thereof is 2.7 mm, the horizontal width L1 of the hole 301 in the insulation sheet 300 may become 1.7 mm while the longitudinal width L2 thereof may become 3.5 mm.

Further, referring to FIG. 3(c), the gap supporter 100 is provided with a metal thin-film 105 on the surface thereof, wherein the metal thin-film 105 may be secured to the printed circuit board 200 by means of soldering 106.

Accordingly, the gap supporter 100 allows the insulation sheet 300 to be secured at a position spaced apart from terminals of the elements 201, 202, 203 and 204 and the printed circuit, thereby protecting the terminals of the elements 201, 202, 203 and 204 and the printed circuit.

As described above, according to the embodiment shown in FIG. 3, due to characteristics of relationship of horizontal and longitudinal lengths (or widths) between the anti-separation part 111 of the gap supporter 100 and the hole 301 of the insulation sheet 300, as well as structural features of the inclined portion 110 formed in the gap supporter 100, there is an advantage in that the insulation sheet 300 is vertically lowered from an upper part of the printed circuit board 200 and then may be joined with the gap supporter 100.

FIG. 4 to FIG. 6 illustrate a gap supporter for a printed circuit board according to another embodiment of the present invention and a package including the gap supporter for a printed circuit board and an insulation sheet joined thereto.

More specifically, FIG. 4 is a perspective view illustrating a gap supporter for a printed circuit board according to another embodiment of the present invention, and FIG. 5 illustrates a top surface and a lateral side of the gap supporter for a printed circuit board according to this embodiment of the present invention. Further, FIG. 6 illustrates a package in which an insulation sheet is joined with the gap supporter for a printed circuit board according to the above embodiment of the present invention.

The embodiment shown in FIGS. 4 to 6 is an exemplary embodiment describing a configuration of joining an insulation sheet 300 with a gap supporter 100 on top of a printed circuit board 200.

Hereinafter, a gap supporter for a printed circuit board according to an embodiment of the present invention and a package in which an insulation sheet is joined with the gap supporter for a printed circuit board will be described with reference to FIG. 4 to FIG. 6.

Referring to FIG. 4 and FIG. 5, the gap supporter 100 for a printed circuit board according to another embodiment of the present invention may be configured to include a fixed body part 101, an anti-separation part 111, an inclined portion 110 and a coupling groove 120.

The fixed body part 101 is fixed to the printed circuit board, and a metal thin-film 105 may be formed on each surface of both ends of the fixed body part 101, wherein the metal thin-film 105 may be secured to one surface of the printed circuit board by means of soldering and may be made of copper (Cu). Further, if the fixed body part 101 is formed in a hexahedral shape, the metal thin-film 105 may be formed on both side surfaces, on both side surfaces and the bottom surface, or on the bottom surface at one end of the fixed body part 101.

More specifically, when the fixed body part 101 is formed in a hexahedral shape, as shown in FIG. 4(a), the metal thin-film 105 may be formed on both side surfaces at a lower end of the fixed body part 101. Alternatively, as shown in FIG. 4(b), the metal thin-film 105 may be formed on both side surfaces and the bottom surface at a lower end of the fixed body part 101. Alternatively, as shown in FIG. 4(c), the metal thin-film 105 may be formed on the bottom surface at a lower end of the fixed body part 101.

The anti-separation part 111 may be formed to be partitioned by the coupling groove 120 on the upper end of the fixing body part 101 and may secure the insulation sheet 300 to prevent separation thereof, wherein the anti-separation part 111 may be formed on only either one among both opposite sides at the upper end of the fixing body part 101.

In addition, a width W1 of the anti-separation part 111 is formed smaller than a width W3 of the fixing body part 101, thereby making it easier to insert the insulation sheet 300.

The inclined portion 110 may be formed in a slope shape by chamfering a corner or a vertex portion at the upper end of the fixed body part 101, which corresponds to the anti-separation part 111, wherein the inclined portion 110 may be formed on only either one among both opposite sides at the upper end of the fixed body part 101.

Similarly, the coupling groove 120 may be formed on only either one among both opposite sides at the upper end of the fixed body part 101 and, more specifically, may be formed to face from the surface of the fixed body part 101 to the inside thereof.

The coupling groove 120 may be formed spaced apart from the metal thin-film 105, and a width W1 of the anti-separation part 111 at one side where the inclined portion 110 of the fixed body part 101 is formed may be formed smaller than a width W3 at another side where the metal thin-film 105 of the fixed body part 101 is formed, whereby the gap supporter 100 is stably fixed on the printed circuit board 200 while the insulation sheet 300 may be more easily inserted and stably secured therein.

Further, no inclined portion is present at an inner corner or a vertex portion of the coupling groove 120, so that the insulation sheet 300 may not be easily separated from the coupling groove 120.

In other words, the width W3 of the side where the metal thin-film 105 is formed may be formed larger than the width W1 of the side where the inclined portion 110 is formed, so as to provide a stepped portion, whereby the insulation sheet 300 may be stably supported by the fixed body part 101.

Referring to FIG. 6, the package in which the insulation sheet 300 is joined with the gap supporter 100 for a printed circuit board 200 according to one embodiment of the present invention may have a configuration of mounting the gap supporter 100 on the printed circuit board 200 to secure the insulation sheet 300, thereby protecting elements 201, 202, 203 and 204 and a printed circuit mounted on the printed circuit board 200.

Referring to FIG. 6(a), the insulation sheet 300 has a hole 301, and the gap supporter 100 is joined in the hole 301.

In this case, the coupling groove 120 of the gap supporter shown in FIG. 5 is coupled at an end of the hole 301 in the insulation sheet 300, wherein the hole 301 of the insulation sheet 300 passing through the inclined portion 110 of the gap supporter 100 is inserted in and coupled to the coupling groove 120.

That is, the hole 301 of the insulation sheet 300 may slide along the inclined portion 110 and then may be coupled in the coupling groove 120.

Accordingly, the anti-separation part 111 of the gap supporter 100 shown in FIG. 5 may prevent separation of the insulation sheet 300.

Referring to FIG. 6(b), in order to easily insert the anti-separation part 111 of the gap supporter 100 into the hole 301 of the insulation sheet 300 and, thereafter, firmly fix the same therein without being separated, a horizontal width W1 of the anti-separation part 111 in the gap supporter 100 may be formed larger than a horizontal width L1 of the hole 301 in the insulation sheet 300, while a longitudinal width W2 of the anti-separation part 111 in the gap supporter 100 may be formed smaller than a longitudinal width L2 of the hole 301 in the insulation sheet 300.

Further, referring to FIG. 6(c), the gap supporter 100 is provided with a metal thin-film 105 on the surface thereof, wherein the metal thin-film 105 may be secured to the printed circuit board 200 by means of soldering 106.

Accordingly, the gap supporter 100 allows the insulation sheet 300 to be secured at a position spaced apart from terminals of the elements 201, 202, 203 and 204 and the printed circuit, thereby protecting the terminals of the elements 201, 202, 203 and 204 and the printed circuit.

As described above, according to the embodiment shown in FIG. 6, due to characteristics of relationship of horizontal and longitudinal lengths (or widths) between the anti-separation part 111 of the gap supporter 100 and the hole 301 of the insulation sheet 300, as well as structural features of the coupling groove 120 formed on only one side of the gap supporter 100, there is an advantage in that either one 100 of the gap supporters 100 at both sides is joined with the insulation sheet 300 and the other gap supporter 100 may be successively joined, so as to easily and firmly join the insulation sheet 300.

FIG. 7 to FIG. 9 illustrate a gap supporter for a printed circuit board according to another embodiment of the present invention and a package including the gap supporter for a printed circuit board and an insulation sheet joined thereto.

The embodiment shown in FIG. 7 to FIG. 9 is an exemplary embodiment describing the insulation sheet joined at a lateral side of the gap supporter and, in more detail, FIG. 7 is a perspective view illustrating a gap supporter for a printed circuit board according to another embodiment of the present invention, and FIG. 8 illustrates a top surface and a lateral side of the gap supporter for a printed circuit board according to this embodiment of the present invention. Further, FIG. 9 illustrates a package in which an insulation sheet is joined with the gap supporter for a printed circuit board according to the above embodiment of the present invention.

Referring to FIG. 7 and FIG. 8, the gap supporter 100 may include a fixed body part 101, an anti-separation part 111 and a coupling groove 120.

The fixed body part 101 is fixed on the printed circuit board, and a metal thin-film 105 is formed on the surface of a lower end of the fixed body part 101 wherein the metal thin-film 105 may be fixed on one surface of the printed circuit board by means of soldering and may be made of copper (Cu).

Further, if the fixed body part 101 is formed in a hexahedral shape, the metal thin-film 105 may be formed on both side surfaces, on both side surfaces and the bottom surface, or on the bottom surface at the lower end of the fixed body part 101.

More specifically, when the fixed body part 101 is formed in a hexahedral shape, as shown in FIG. 7(*a*), the metal thin-film 105 may be formed on both side surfaces at the lower end of the fixed body part 101. Alternatively, as shown in FIG. 7(*b*), the metal thin-film 105 may be formed on both side surfaces and the bottom surface at the lower end of the fixed body part 101. Alternatively, as shown in FIG. 7(*c*), the metal thin-film 105 may be formed on the bottom surface at the lower end of the fixed body part 101.

The coupling groove 120 is formed in a groove shape on the fixed body part 101, and the insulation sheet is inserted and coupled thereto, so as to protect an element on one surface of the printed circuit board 200, wherein the coupling groove 120 may be formed on only either one among both opposite sides at an upper end of the fixed body part 101.

In other words, referring to FIG. 7 and FIG. 8, the coupling groove 120 may be formed on only either one among both opposite side surfaces at the other end of the fixed body part 101.

Further, the anti-separation pan 111 may be formed on the other end of the fixed body part 101 to be partitioned by the coupling groove 120, so as to secure the insulation sheet and thus prevent separation thereof.

Further, referring to FIG. 9(*a*), the coupling groove 120 of the gap supporter 100 may be coupled to an end of the insulation sheet 300 to secure the same and, in order to secure multiple ends of the insulation sheet 300, a plurality of gap supporters may be required.

Accordingly, the insulation sheet is joined in a sliding manner through a lateral side of the gap supporter so as to enhance convenience in joining the insulation sheet and, at the same time, to very stably secure the insulation sheet 300 by the plurality of gap supporters 100.

Referring to FIG. 9(*b*), the gap supporter 100 is provided with the metal thin-film 105, wherein the metal thin-film 105 is fixed on the printed circuit board 200 by means of soldering 106. Therefore, the gap supporter 100 may secure the insulation sheet 300 at a position spaced apart from terminals of elements 201, 202, 203, 204 and a printed circuit, thereby protecting the terminals of the elements 201, 202, 203 and 204, and the printed circuit.

In addition, the gap supporter 100 in the embodiments shown in FIG. 7 to FIG. 9 may also have an inclined portion, and this inclined portion may be formed in a slope shape by chamfering a corner or a vertex portion of the anti-separation part 111, thereby achieving functions of improving convenience in joining the insulation sheet 300.

FIG. 10 to FIG. 12 illustrate a gap supporter for a printed circuit board according to another embodiment of the present invention and a package including the gap supporter for a printed circuit board and an insulation sheet joined thereto.

FIG. 10 to FIG. 12 illustrate an embodiment wherein the insulation sheet is joined with a lateral side of the gap supporter. In more detail, FIG. 10 is a perspective view illustrating a gap supporter for a printed circuit board according to another embodiment of the present invention, FIG. 11 illustrates a top surface and a lateral side of the gap supporter for a printed circuit board according to this embodiment of the present invention. Further, FIG. 12 illustrates a package in which an insulation sheet is joined with the gap supporter for a printed circuit board according to the above embodiment of the present invention.

Referring to FIG. 10 and FIG. 11, the gap supporter may include a fixed body part 101, an anti-separation part 111 and a coupling groove 120.

The fixed body part 101 is fixed to the printed circuit board, and a metal thin-film is formed on the surface of a lower end of the fixed body part 101, wherein the metal thin-film 105 may be fixed on one surface of the printed circuit board by means of soldering and may be made of copper (Cu). If the fixed body part 101 is formed in a hexahedral shape, the metal thin-film 105 may be formed on both side surfaces, on both side surfaces and the bottom surface, or on the bottom surface at the lower end of the fixed body part 101.

More specifically, when the fixed body part 101 is formed in a hexahedral shape, as shown in FIG. 10(*a*), the metal thin-film 105 may be form on both side surfaces at the lower end of the fixed body part 101. Alternatively, as shown in FIG. 10(*b*), the metal thin-film 105 may be formed on both side surfaces and the bottom surface at the lower end of the fixed body part 101. Alternatively, as shown in FIG. 10(*c*), the metal thin-film 105 may be formed on the bottom surface at the lower end of the fixed body part 101.

The coupling groove 120 is formed in a groove shape on the fixed body part 101, and the insulation sheet is inserted and coupled thereto, so as to protect an element on one surface of the printed circuit board 200, wherein the coupling groove 120 may be formed on both opposite sides at an upper end of the fixed body part 101.

In other words, referring to FIG. 10 and FIG. 11, the coupling groove 120 may be formed on both opposite side surfaces at the other end of the fixed body part 101.

Further, the anti-separation part 111 may be formed at the other end of the fixed body part 101 to be partitioned by the coupling groove 120, so as to secure the insulation sheet and prevent separation thereof.

Referring to FIG. 12(*a*), the coupling groove 120 of the gap supporter 100 may be fixed to an end of the insulation sheet 300 and, in order to secure multiple ends of the insulation sheet 300, a plurality of gap supporters may be required.

Referring to FIG. 9(b), the gap supporter 100 is provided with the metal thin-film 105, wherein the metal thin-film 105 is fixed to the printed circuit board 200 by means of soldering 106. Therefore, the gap supporter 100 may secure the insulation sheet 300 at a position spaced apart from terminals of elements 201, 202, 203, 204 and a printed circuit, thereby protecting the terminals of the elements 201, 202, 203 and 204, and the printed circuit.

Accordingly, the insulation sheet is joined in a sliding manner through a lateral side of the gap supporter so as to enhance convenience in joining the insulation sheet and, at the same time, to very stably secure the insulation sheet 300 by the plurality of gap supporters 100.

In addition, the gap supporter 100 in the embodiment shown in FIG. 10 to FIG. 12 may further include an inclined portion, and this inclined portion may be formed in a slope shape by chamfering a corner or a vertex portion of the anti-separation part 111, thereby achieving functions of improving convenience in joining the insulation sheet 300.

Consequently, according to the embodiments of the present invention, there is provided a method of coupling an insulation sheet that is optimal for characteristics of each printed circuit board based on a structure of the gap supporter, thereby enhancing efficiency and productivity of a manufacturing process.

In the above detailed description of the invention, specific embodiments have been described. However, many modifications are possible without departing from the scope of the invention. The technical spirit of the present invention should not be limited to the aforementioned embodiments of the present invention but should be determined by the appended claims and equivalents thereto.

The invention claimed is:

1. A package including a gap supporter for a printed circuit board and an insulation sheet joined thereto, comprising:
   a printed circuit board on which elements are mounted;
   an insulation sheet to protect the elements of the printed circuit board, which is made of an insulating material; and
   a gap supporter, wherein the gap supporter includes:
      a fixed body part, which has a metal thin-film formed on a surface of a lower end of the fixed body part, and is fixed by soldering the metal thin-film on one surface of the printed circuit board;
      a coupling groove which is formed in a groove shape on the fixed body part, and in which the insulation sheet is inserted and coupled; and
      an anti-separation part which is formed on another end of the fixed body part to be partitioned by the coupling groove, and secures the insulation sheet so as to prevent separation of the insulation sheet.

2. The package according to claim 1, wherein:
   the insulation sheet has a hole,
   the coupling groove of the gap supporter is coupled to an end of the hole in the insulation sheet, and
   the anti-separation part of the gap supporter prevents separation of the insulation sheet.

3. The package according to claim 2, wherein:
   a horizontal width of the anti-separation part in the gap supporter is formed larger than a horizontal width of the hole in the insulation sheet, and
   a longitudinal width of the anti-separation part in the gap supporter is formed smaller than a longitudinal width of the hole in the insulation sheet.

4. The package according to claim 1, wherein a pair of gap supporters includes coupling grooves formed in mutually opposite directions.

5. The package according to claim 1, wherein:
   the coupling groove of the gap supporter is coupled to an end of the insulation sheet, and
   the anti-separation part of the gap supporter prevents separation of the insulation sheet.

6. The package according to claim 1, wherein:
   a plurality of gap supporters is arranged to be mutually symmetrical with one another, and
   the coupling groove in each gap supporter is formed on one side at an upper end of the fixed body part, so as to secure the insulation sheet sliding and being joined in a side direction.

7. The package according to claim 1, wherein a plurality of gap supporters is arranged to be mutually symmetrical with one another.

8. The package according to claim 7, wherein the coupling groove of the gap supporter is formed on each of opposite sides at an upper end of the fixed body part, so as to secure a plurality of insulation sheets.

9. The package according to claim 1, wherein the coupling groove of the gap supporter is formed on either or opposite sides at an upper end of the fixed body part, so as to secure the insulation sheet sliding and being joined in a side direction.

10. A gap supporter for a printed circuit board, comprising:
   a fixed body part, which has a metal thin-film formed on a surface of a lower end of the fixed body part, and is fixed by soldering the metal thin-film on one surface of the printed circuit board;
   a coupling groove which is formed in a groove shape on the fixed body part, and in which the insulation sheet is inserted and coupled; and
   an anti-separation part which is formed on another end of the fixed body part to be partitioned by the coupling groove, and secures the insulation sheet so as to prevent separation of the same.

11. The gap supporter according to claim 10, wherein the metal thin-film is formed on each surface of opposite sides at a lower end of the fixed body part formed in a hexahedral shape.

12. The gap supporter according to claim 10, wherein the coupling groove is formed on either or opposite sides at an upper end of the fixed body part to face the inside of the fixed body part.

13. The gap supporter according to claim 10, wherein the coupling groove is formed spaced part from the metal thin-film.

14. The gap supporter according to claim 10, wherein the coupling groove is joined in a hole formed in the insulation sheet or at an end of the insulation sheet.

15. The gap supporter according to claim 10, further comprising an inclined portion formed by chamfering each corner of either or opposite sides at an upper end of the anti-separation part.

16. The gap supporter according to claim 10, wherein a width of the anti-separation part is formed smaller than a width of the fixed body part.

17. The gap supporter according to claim 10, wherein the coupling groove is formed on either or opposite sides at the upper end of the fixed body part, so as to secure the insulation sheet sliding and being joined in a side direction.

* * * * *